United States Patent
Li et al.

(10) Patent No.: US 9,589,837 B2
(45) Date of Patent: Mar. 7, 2017

(54) ELECTRODE MANUFACTURING METHOD, FUSE DEVICE AND MANUFACTURING METHOD THEREFOR

(71) Applicant: Semiconductor Manufacturing International (Shanghai) Corporation, Shanghai (CN)

(72) Inventors: Ying Li, Shanghai (CN); Guanping Wu, Shanghai (CN)

(73) Assignee: SEMICONDUCTOR MANUFACTURING INTERNATIONAL (SHANGHAI) CORPORATION (CN)

(*) Notice: Subject to any disclaimer, the term of this patent is extended or adjusted under 35 U.S.C. 154(b) by 0 days.

(21) Appl. No.: 14/054,371

(22) Filed: Oct. 15, 2013

(65) Prior Publication Data
US 2014/0145298 A1 May 29, 2014

(30) Foreign Application Priority Data
Nov. 23, 2012 (CN) .......................... 2012 1 0483777

(51) Int. Cl.
H01L 27/24 (2006.01)
H01L 21/768 (2006.01)
H01L 45/00 (2006.01)
H01L 23/525 (2006.01)

(52) U.S. Cl.
CPC .... *H01L 21/76877* (2013.01); *H01L 23/5256* (2013.01); *H01L 45/06* (2013.01); *H01L 45/1233* (2013.01); *H01L 45/1253* (2013.01); *H01L 45/144* (2013.01); *H01L 45/16* (2013.01); *H01L 27/24* (2013.01); *H01L 2924/0002* (2013.01)

(58) Field of Classification Search
CPC .. G11C 13/0004; G11C 11/5678; H01L 45/06
USPC .......................................... 257/529; 438/95
See application file for complete search history.

(56) References Cited

U.S. PATENT DOCUMENTS

| 6,136,664 A | * | 10/2000 | Economikos et al. ........ 438/431 |
| 7,504,653 B2 | * | 3/2009 | Lung ................................. 257/2 |
| 8,158,965 B2 | * | 4/2012 | Chen .................. G11C 11/5678 257/2 |
| 8,168,538 B2 | * | 5/2012 | Chen et al. ................... 438/682 |

(Continued)

FOREIGN PATENT DOCUMENTS

| CN | 101159312 A | 4/2008 |
| CN | 101567360 A | 10/2009 |
| CN | 101677080 A | 3/2010 |

*Primary Examiner* — John C Ingham
(74) *Attorney, Agent, or Firm* — Innovation Counsel LLP

(57) ABSTRACT

The present disclosure relates to an electrode manufacturing method, and a fuse device and manufacturing method therefor. The fuse device includes a fuse element including a phase change material, and a first electrode formed in contact with the fuse element. The phase change material may include doped or undoped chalcogenide. The first electrode may have a sublithographic dimension at a portion where the first electrode contacts the fuse element. When the phase change material has a layer thickness less than or equal to about 30 nm, and a pulse current less than or equal to about 3 mA is applied to the fuse element via the first electrode, the fuse element may undergo a phase change, so as to convert the fuse device into a blow-out state.

11 Claims, 9 Drawing Sheets

(56) References Cited

U.S. PATENT DOCUMENTS

| | | | |
|---|---|---|---|
| 8,198,619 B2* | 6/2012 | Lee et al. | 257/4 |
| 8,315,088 B2* | 11/2012 | Lung | 365/163 |
| 8,728,859 B2* | 5/2014 | Breitwisch et al. | 438/102 |
| 2001/0049189 A1 | 12/2001 | Zahorik | |
| 2008/0192534 A1* | 8/2008 | Lung | G11C 11/5678 365/163 |
| 2008/0197334 A1* | 8/2008 | Lung | H01L 45/06 257/2 |
| 2009/0072215 A1* | 3/2009 | Lung et al. | 257/4 |

* cited by examiner

ELECTRODE MANUFACTURING METHOD, FUSE DEVICE AND MANUFACTURING METHOD THEREFOR

CROSS-REFERENCE TO RELATED APPLICATION

This application claims priority to Chinese Patent Application No. 201210483777.9 filed on Nov. 23, 2012 and entitled "Electrode Manufacturing Method, Fuse Device and Manufacturing Method therefor", which is incorporated herein by reference in its entirety.

BACKGROUND OF THE INVENTION

Field of the Invention

The present disclosure relates generally to an electrode manufacturing method, and a fuse device and manufacturing method therefor. In particular, the present disclosure relates to a fuse device having a fuse element that includes a phase change material, and a method for manufacturing the fuse device.

Description of the Related Art

A fuse device (sometimes referred to as an E-Fuse device) is a component commonly found in electronic products. The fuse device can be used for different purposes. For example, the fuse device can be used to switch off redundant memory, or to adjust the resistance and capacitance parameters in an RF (Radio Frequency) circuit ("RC trimming"), by 'blowing' one or more fuse elements in the fuse device.

A conventional fuse device in the prior art may include a metal or polysilicon as the material for a fuse element. However, a high current is typically required to blow the fuse element in the conventional fuse device, with the time required to blow the fuse element on the order of milliseconds (ms). The high current (coupled with the required time to blow the fuse element) may result in high power consumption of the fuse device. Furthermore, the high current needed to blow the fuse element may require a switching element (e.g., a transistor) to be connected to the fuse element. This may result in the conventional fuse device occupying a large area on a semiconductor chip, thereby consuming valuable space on the chip.

Alternatively, a fuse element (formed of metal, for example) can be blown using laser light. However, this process is typically performed prior to chip packaging and may result in low manufacturing yield. As a result, the type of applications that can use this (laser) process is limited.

SUMMARY

The present disclosure is directed to address at least one of the above problems in the prior art.

According to some embodiments of the inventive concept, a fuse device is provided. The fuse device includes: a fuse element including a phase change material, and a first electrode formed in contact with the fuse element.

In some embodiments, a dimension of the first electrode, at a portion where the first electrode contacts the fuse element, may include a sublithographic dimension, the sublithographic dimension being a length less than or equal to about 100 nm.

In some embodiments, the sublithographic dimension may be less than or equal to about 75 nm.

In some embodiments, the phase change material may include doped or undoped chalcogenide.

In some embodiments, the phase change material may include doped or undoped Ge—Sb—Te, or doped or undoped Sb—Te.

In some embodiments, the phase change material may have a layer thickness less than or equal to about 30 nm.

In some embodiments, the fuse element and the first electrode may be embedded in one or more interlayer dielectrics or intermetallic dielectrics.

In some embodiments, the fuse device may further include a second electrode, wherein the first electrode and the second electrode are located on opposite sides of the fuse element.

In some embodiments, when the phase change material has a layer thickness less than or equal to about 30 nm, and a pulse current less than or equal to about 3 mA is applied to the fuse element via the first electrode, the fuse element may undergo a phase change, so as to convert the fuse device into a blow-out state.

According to some embodiments of the inventive concept, a method for manufacturing an electrode is provided. The method includes forming a first dielectric layer on a substrate, forming a second dielectric layer on the first dielectric layer, and forming a third dielectric layer on the second dielectric layer; forming, by a first etching process, a first via hole in the second dielectric layer and the third dielectric layer; forming a fourth dielectric layer on the third dielectric layer, wherein a first portion of the fourth dielectric layer is formed on sidewalls of the first via hole, a second portion of the fourth dielectric layer is formed on a bottom surface of the first via hole, and third portions of the fourth dielectric layer are formed on top surfaces of the third dielectric layer external to the first via hole; removing, by a second etching process, the second and third portions of the fourth dielectric layer; forming, by a third etching process, a second via hole in the first dielectric layer using the first portion of the fourth dielectric layer as an etching barrier layer, wherein the second via hole extends through the first dielectric layer to a surface of the substrate; filling the second via hole with an electrode material; and forming, by a polishing process, the electrode, wherein the electrode is embedded in the first dielectric layer.

In some embodiments, a dimension of the electrode, at a portion where the electrode contacts the fuse element, may include a sublithographic dimension.

In some embodiments, the sublithographic dimension may be less than or equal to about 100 nm.

In some embodiments, the sublithographic dimension may be less than or equal to about 75 nm.

In some embodiments, the method may further include forming a fuse element in contact with the first electrode, wherein the fuse element includes a phase change material.

In some embodiments, the phase change material may include doped or undoped chalcogenide.

In some embodiments, the phase change material may include doped or undoped Ge—Sb—Te, or doped or undoped Sb—Te.

In some embodiments, the phase change material may have a layer thickness less than or equal to about 30 nm.

In some embodiments, the fuse element and the first electrode may be embedded in one or more interlayer dielectrics or intermetallic dielectrics.

In some embodiments, the method may further include forming a second electrode, wherein the first electrode and the second electrode are located on opposite sides of the fuse element.

In some embodiments, when the phase change material has a layer thickness less than or equal to about 30 nm, and a pulse current less than or equal to about 3 mA is applied to the fuse element via the first electrode, the fuse element may undergo a phase change, so as to convert the fuse device into a blow-out state.

Further features of the disclosure will be apparent from the following detailed description of various embodiments with reference to the accompanying drawings.

BRIEF DESCRIPTION OF THE DRAWINGS

The accompanying drawings, which are incorporated herein and constitute a part of the specification, illustrate different embodiments of the inventive concept and, together with the description, serve to describe more clearly the inventive concept.

It is noted that in the accompanying drawings, for convenience of description, the dimensions of the components shown may not be drawn to scale. Also, same or similar reference numbers between different drawings represent the same or similar components.

The objects, features, and advantages of the inventive concept will be apparent from the following detailed description of the different embodiments with reference to the accompanying drawings.

DESCRIPTION OF THE EMBODIMENTS

Various embodiments of the inventive concept are next described with reference to the accompanying drawings. It is noted that the following description of the different embodiments is merely illustrative in nature, and is not intended to limit the inventive concept, its application, or use. The relative arrangement of the components and steps, and the numerical expressions and the numerical values set forth in these embodiments, do not limit the scope of the inventive concept unless otherwise specifically stated. In addition, techniques, methods, and devices as known by those skilled in the art, although omitted in some instances, are intended to be part of the specification where appropriate.

Figure 1:
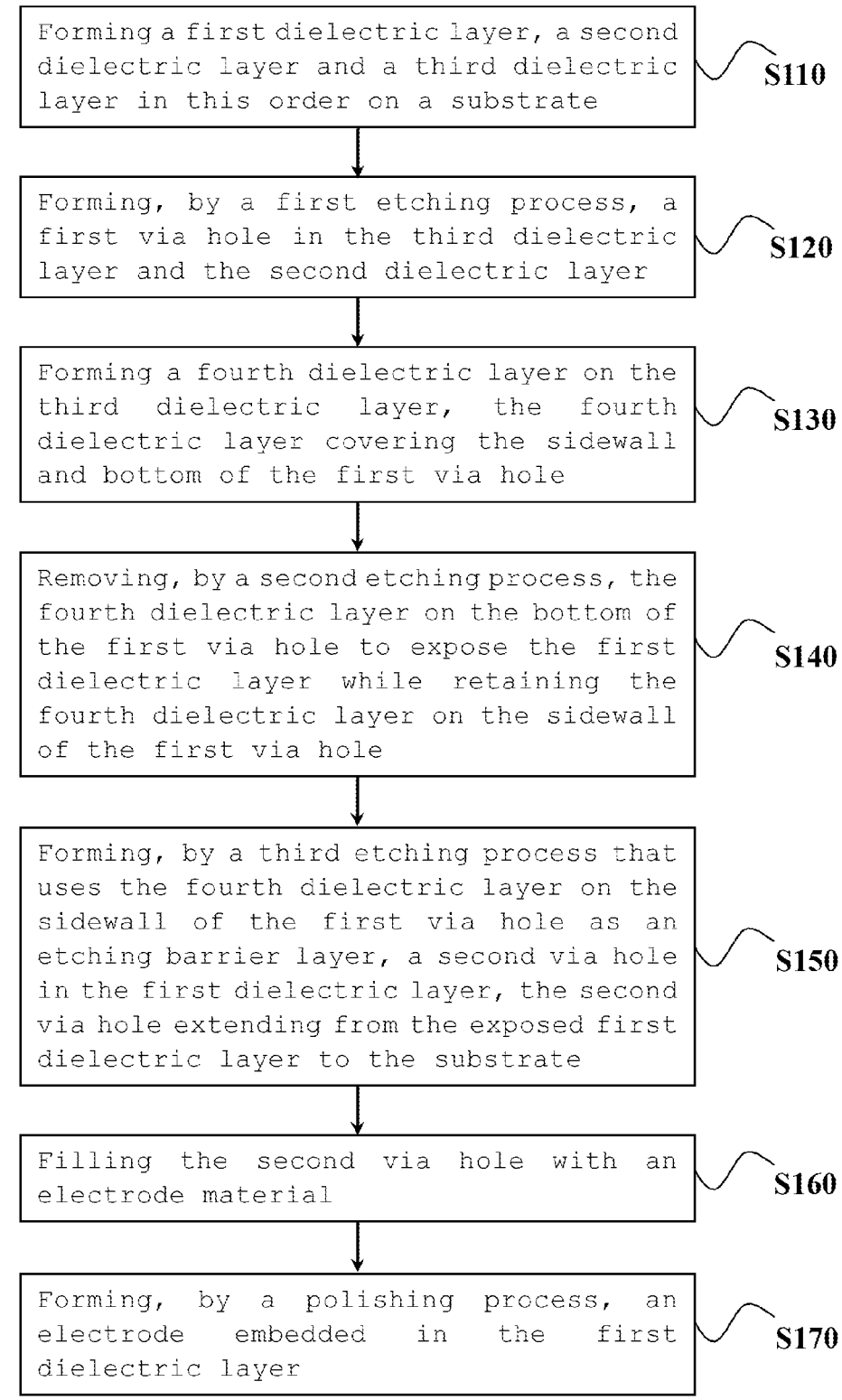
FIG. 1 is a flowchart of a method for manufacturing an electrode according to an embodiment of the inventive concept.

A method for manufacturing an electrode according to an embodiment of the inventive concept is next described in detail with reference to FIG. 1 and FIGS. 3A to 3G. FIG. 1 is a flowchart of the method, and FIGS. 3A to 3G are cross-sectional views of the electrode at different stages of fabrication corresponding to the steps in the flowchart of FIG. 1.

First, with reference to step S110 of FIG. 1, a first dielectric layer 310 is formed on a substrate 300, a second dielectric layer 320 is formed on the first dielectric layer 310, and a third dielectric layer 330 is formed on the second dielectric layer 320. (See, e.g., FIG. 3A). The first dielectric layer 310, the second dielectric layer 320, and the third dielectric layer 330 may be formed in the order as stated above.

The substrate 300 may include, for example, a semiconductor substrate (such as a Si substrate). In some embodiments, devices such as diodes, CMOS, and other semiconductor devices may be formed in the substrate 300 prior to forming the dielectric layers 310, 320, and 330.

In some embodiments, the first dielectric layer 310, the second dielectric layer 320, and the third dielectric layer 330 may include either interlayer dielectrics (ILD) or intermetallic dielectrics (IMD). The first dielectric layer 310, the second dielectric layer 320, and the third dielectric layer 330 may be formed using appropriate deposition methods.

In some embodiments, the first dielectric layer 310 and the third dielectric layer 330 may be formed of silicon oxide, and the second dielectric layer 320 may be formed of silicon nitride. In some embodiments, the second dielectric layer 320 and the third dielectric layer 330 may serve as sacrificial layers, and may be removed in subsequent process steps.

Next, in step S120, a first via hole 335 is formed in the third dielectric layer 330 and the second dielectric layer 320 using a first etching process, with the first via hole 335 exposing a surface portion of the first dielectric layer 310. (See, e.g., FIG. 3B).

The first via hole 335 may be formed using appropriate etching methods. The shape of the first via hole 335 may be defined using a photolithographic process (not shown).

Next, in step S130, a fourth dielectric layer 340 is formed conformally over the etched third dielectric layer 330, with the fourth dielectric layer 340 covering at least the sidewalls and bottom surface of the first via hole 335. (See, e.g., FIG. 3C).

The fourth dielectric layer 340 may be formed using appropriate deposition methods. In some embodiments, the fourth dielectric layer 340 may be formed of silicon nitride.

Figure 3A:
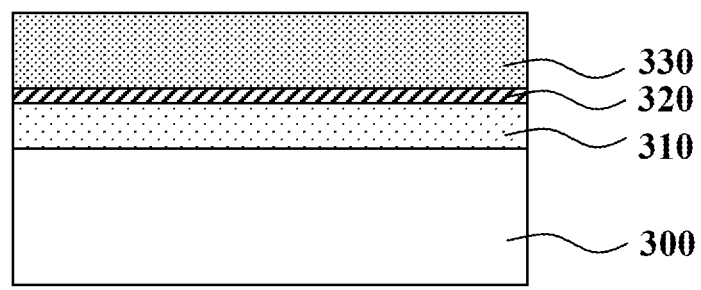
FIGS. 3A to 3G are cross-sectional views of an electrode at different stages of fabrication corresponding to the steps in the flowchart of FIG. 1.
Figure 3B:
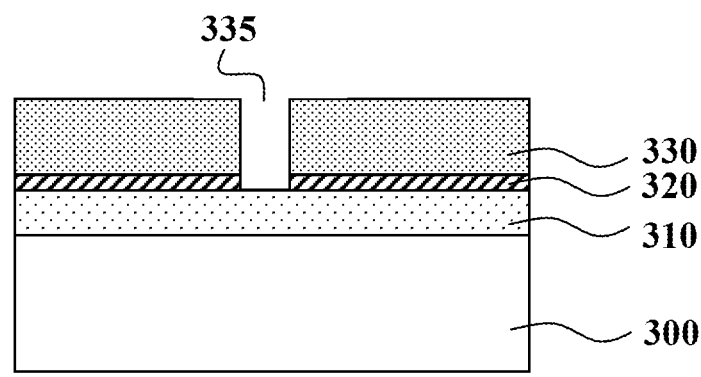
Figure 3C:
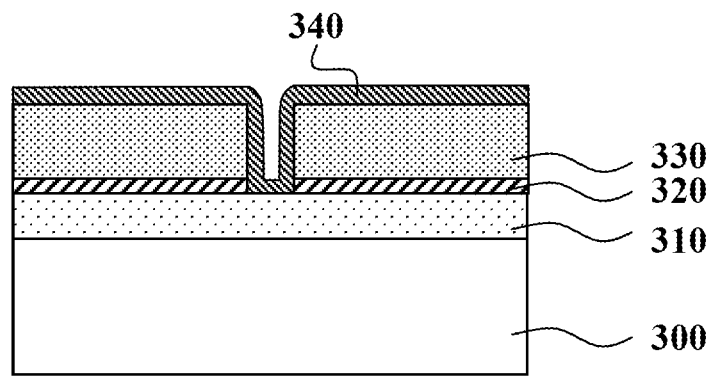

As shown in FIG. 3C, a portion of the fourth dielectric layer 340 formed on the bottom surface of the first via hole 335 is in contact with a portion of the first dielectric layer 310, and a portion of the fourth dielectric layer 340 formed on the sidewalls of the first via hole 335 is in contact with side portions of the second dielectric layer 320 and the etched third dielectric layer 330.

It is noted that Step S130 can be used to define a dimension of an electrode (e.g., electrode 355 shown in FIG. 3G) subsequently formed in the first dielectric layer 310. The electrode can be formed having a sublithographic dimension, which is a dimension that is less than the minimum dimension achievable using current lithographic techniques.

Referring to FIG. 3C, the portions of the fourth dielectric layer 340 formed within the first via hole 335 can reduce a dimension (e.g., diameter or width) of the first via hole 335. For example, a dimension of the first via hole 335 can be reduced by increasing the thickness of the fourth dielectric layer 340. By further reducing the dimension of the first via hole 335 to a sublithographic dimension, a second via hole (e.g., second via hole 345 shown in FIG. 3E) having a sublithographic dimension can be formed in the first dielectric layer 310, by using the portion of the fourth dielectric layer 340 in the reduced first via hole 335 as an etch mask. Subsequently, an electrode (e.g., electrode 355) having a sublithographic dimension can be formed in the second via hole.

Next, in step S140, the portion of the fourth dielectric layer 340 formed on the bottom surface of the first via hole 335, as well as portions of the fourth dielectric layer 340 formed on the top surface of the etched third dielectric layer 330 (external to the first via hole 335), are removed using a second etching process. The second etching process may be performed using appropriate etching methods.

Figure 3D:
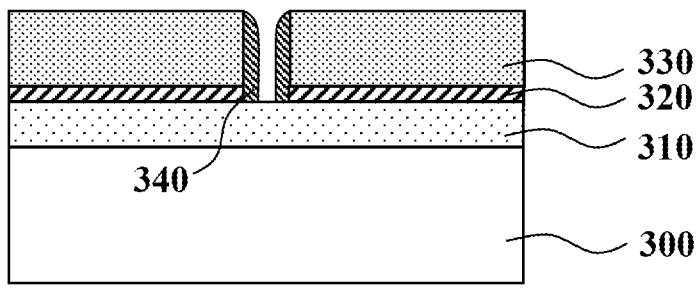

As shown in FIG. 3D, the portion of the first dielectric layer 310 previously in contact with the fourth dielectric layer 340 is exposed (at the bottom surface of the first via hole 335) after the second etching process. The top surface of the etched third dielectric layer 330 (external to the first via hole 335) is also exposed after the second etching process. As further shown in FIG. 3D, the portion of the fourth dielectric layer 340 formed on the sidewalls of the first via hole 335 remains after the second etching process.

Next, in step S150, a second via hole 345 is formed in the first dielectric layer 310 using a third etching process. The third etching process may be performed using appropriate etching methods.

Figure 3E:
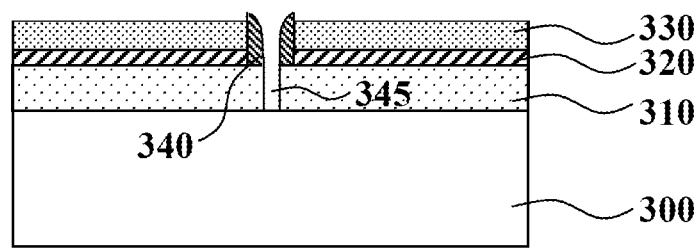
Figure 3F:
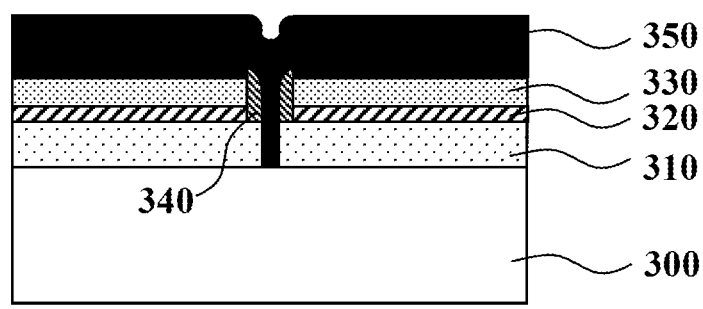
Figure 3G:
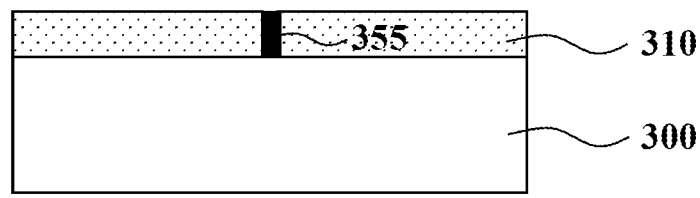

During the third etching process, the portion of the fourth dielectric layer 340 formed on the sidewalls of the first via hole 335 may serve as an etching barrier layer. As shown in FIG. 3E, the second via hole 345 is formed in the first dielectric layer 310, with the second via hole 345 extending through the first dielectric layer 310 to the surface of the substrate 300.

Referring to FIG. 3E, a top portion of the fourth dielectric layer 340 formed on the sidewalls of the first via hole 335 may be removed after the third etching process. Additionally, a top portion of the etched third dielectric layer 330 may be removed after the third etching process. As shown in FIGS. 3D and 3E, the height of the portion of the fourth dielectric layer 340 formed on the sidewalls of the first via hole 335, as well as the thickness of the etched third dielectric layer 330, may be reduced after the third etching process.

In the present disclosure, the smallest dimension (of any via hole or electrode) is referred to as a critical dimension. The critical dimension may also refer to the dimension of the via hole or electrode in the plane of contact with a fuse element. (See, e.g., FIG. 4B).

As shown in FIGS. 3B and 3E, a dimension (e.g., diameter or width) of the second via hole 345 is less than the corresponding dimension (e.g., diameter or width) of the first via hole 335. Thus, the dimension of the second via hole 345 constitutes the critical dimension.

The critical dimension can be a sublithographic dimension. As previously described, the portion of the fourth dielectric layer 340 formed on the sidewalls of the first via hole 335 may serve as an etching barrier layer. By increasing the thickness of the portion of the fourth dielectric layer 340 formed on the sidewalls of the first via hole 335, a second via hole 345 having a sublithographic dimension may be formed in the first dielectric layer 310 after the third etching process.

In some embodiments, the second via hole 345 may have a dimension less than or equal to about 100 nm. In some other embodiments, the second via hole 345 may have a dimension less than or equal to about 75 nm (for example, the dimension may be about 70 nm).

As previously described, if a second via hole 345 has a sublithographic dimension, an electrode formed in the second via hole 345 will also have a sublithographic dimension. When an electrode having a sublithographic dimension is included in a fuse device, the blow-out current of the fuse device can be reduced.

In some embodiments, the first dielectric layer 310 is not etched during the second and/or third etching processes. In those embodiments, the second dielectric layer 320 may serve as an etching barrier layer to protect the underlying first dielectric layer 310 during the second and third etching processes.

In some embodiments, the first dielectric layer 310 and the third dielectric layer 330 may be formed of a same material (e.g., silicon oxide), and the second dielectric layer 320 and the fourth dielectric layer 340 may be formed of another same material (e.g., silicon nitride). However, the materials in the dielectric layers 310, 320, 330, and 340 are not limited to the above-described embodiments. For example, any material may be used for the dielectric layers 310, 320, 330, and 340, as long as: (1) the portion of the fourth dielectric layer 340 formed on the bottom surface of the first via hole 335 can be removed using the second etching process, and the portion of the fourth dielectric layer 340 formed on the sidewalls of the first via hole 335 remains after the second etching process; and (2) a portion of the first dielectric layer 310 can be etched during the third etching process using the portion of the fourth dielectric layer 340 formed on the sidewalls of the first via hole 335 as an etching barrier layer.

Next, in step S160, an electrode material 350 is deposited over the structure of FIG. 3E, with the electrode material 350 filling the second via hole 345. (See, e.g., FIG. 3F). The second via hole 345 can be filled with the electrode material 350 using appropriate deposition methods. The electrode material 350 can include, for example, tungsten (W).

In some embodiments, an adhesive layer (not shown) can be formed over the structure of FIG. 3E prior to depositing the electrode material 350, so as to improve adhesion of the electrode material 350 to the sidewalls and bottom surface of the second via hole 345.

Finally, in step S170, an electrode 355 embedded in the first dielectric layer 310 is formed using a polishing process. (See, e.g., FIG. 3G).

The polishing process can be performed using appropriate surface planarization processes. For example, chemical mechanical polishing (CMP) can be performed on a top surface of the structure of FIG. 3F until a surface of the first dielectric layer 310 is exposed, so as to form an electrode 355 embedded in the first dielectric layer 310. As previously described, the first dielectric layer 310 can include an interlayer dielectric or intermetallic dielectric. Thus, the electrode 355 may be formed embedded in an interlayer dielectric or intermetallic dielectric.

As previously described, a second via hole with a sublithographic dimension allows an electrode to be formed in the second via hole having a sublithographic dimension. Therefore, if a second via hole 345 has a sublithographic dimension, an electrode 355 formed in the second via hole 345 (embedded in the first dielectric layer 310) can also have a sublithographic dimension. In some embodiments, the electrode 355 can have a dimension less than or equal to about 100 nm. In some other embodiments, the electrode 355 can have a dimension less than or equal to about 75 nm (for example, the dimension can be about 70 nm).

As previously described, including an electrode (e.g., electrode 355) having a sublithographic dimension in a fuse device can reduce the blow-out current of the fuse device. This can decrease power consumption of the fuse device and reduce the area on the semiconductor chip occupied by the fuse device.

Figure 2:
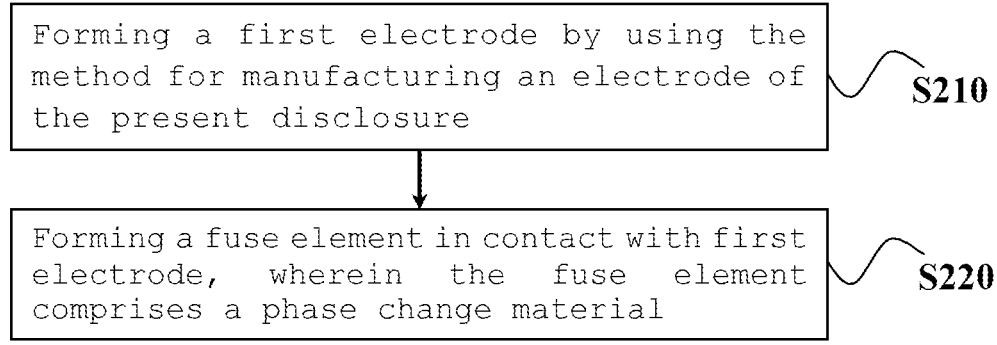
FIG. 2 is a flowchart of a method for manufacturing a fuse device according to an embodiment of the inventive concept.
Figure 4A:
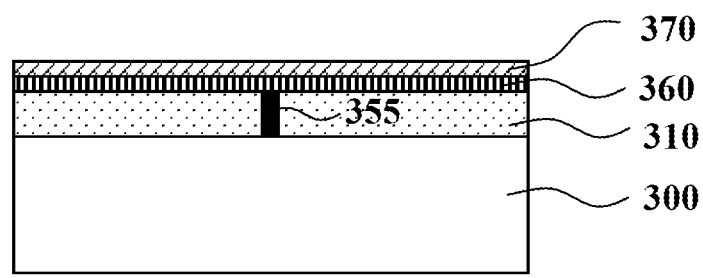
FIGS. 4A and 4B are cross-sectional views of a fuse device at different stages of fabrication corresponding to the steps in the flowchart of FIG. 2.
Figure 4B:
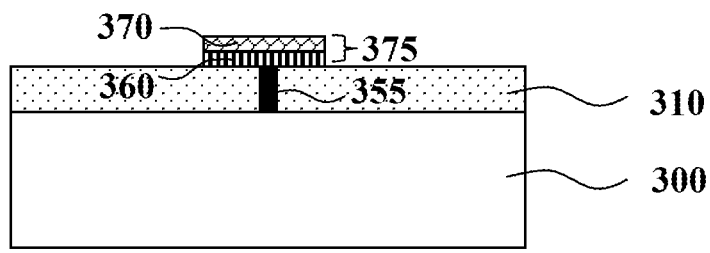

Next, a method for manufacturing a fuse device according to an embodiment of the inventive concept is described in detail below with reference to FIGS. 2, 4A, and 4B. FIG. 2 is a flowchart of the method, and FIGS. 4A and 4B are cross-sectional views of the fuse device at different stages of fabrication corresponding to the steps in the flowchart of FIG. 2.

First, with reference to step S210 of FIG. 2, an electrode (e.g., first electrode 355 embedded in a first dielectric layer 310) is formed on a substrate (e.g., substrate 300). Reference may be made to the previous description of FIGS. 1 and 3A to 3G for the materials in the electrode (e.g., first electrode 355) and the formation method thereof.

Next, in step S220, a fuse element (e.g., fuse element 375) in contact with the electrode (e.g., first electrode 355) is formed, wherein the fuse element includes a phase change material (e.g., phase change material layer 360). (See, e.g., FIGS. 4A and 4B).

The fuse element (e.g., fuse element 375) may be formed as follows. Referring to FIG. 4A, a phase change material layer 360 is formed on the first dielectric layer 310 and the first electrode 355, and a thermal insulating layer 370 is formed on the phase change material layer 360. The phase change material layer 360 and the thermal insulating layer 370 may be formed using appropriate processes in the art. Next, referring to FIG. 4B, a fuse element 375 in contact with the first electrode 355 is formed by patterning and etching portions of the phase change material layer 360 and the thermal insulating layer 370. The resulting structure of FIG. 4B constitutes a fuse device according to an embodiment of the inventive concept.

In some embodiments, devices such as diodes, CMOS, and other semiconductor devices can be formed in the substrate 300 prior to forming the phase change material layer 360 and thermal insulating layer 370 on the substrate 300. In those embodiments, the fuse device may be combined with different semiconductor devices such as diodes and CMOS.

In some embodiments, the thermal insulating layer 370 can minimize the dissipation of heat from the phase change material 360. The dissipation of heat can influence phase change and increase the difficulty in controlling the phase change of the (phase change) material. In some embodiments, the thermal insulating layer 370 may be formed of TiN.

In some embodiments, the thermal insulating layer 370 may be optional and need not be included in the structure of the fuse element 375. In those embodiments, a phase change material layer 360 may be formed on the first electrode 355, and the phase change material layer 360 patterned to form a fuse element.

The phase change material 360 may be, for example, a material that can undergo a phase change between a crystalline state and an amorphous state. The phase change can result in a change in properties of the phase change material (such as volume and resistivity). In some embodiments, the phase change material 360 may include chalcogenide, which may further include doped or undoped chalcogenide. The chalcogenide may include, for example, doped or undoped Ge—Sb—Te, doped or undoped Sb—Te material, etc. In some embodiments, the phase change material layer 360 may include doped or undoped $Ge_2Sb_2Te_5$. In other embodiments, the phase change material layer 360 may include doped or undoped $Sb_2Te_3$.

In some embodiments, a phase change material 360 that includes chalcogenide can undergo a significant change in volume after a phase change. This is because chalcogenide generally has a low glass transition temperature and therefore, the volume of chalcogenide can shrink significantly (for example, by about 7%) when chalcogenide changes from a crystalline state to an amorphous state.

In a fuse element (e.g., fuse element 375) formed of a phase change material (e.g., a phase change material 360, such as chalcogenide), blow-out of the fuse element may depend on the change in volume of the phase change material between different phases. By applying a predetermined current to the phase change material, a phase change can occur wherein the phase change material changes from a crystalline state to an amorphous state. The phase change can cause the volume of the phase change material to shrink, which may result in the phase change material peeling off from an electrode (e.g., first electrode 355). When that happens, a blowout of the fuse element occurs.

Referring to FIG. 4B, an effective phase change region of the phase change material in a fuse element 375 can be reduced if a first electrode 355 has a sublithographic dimension (at a portion where the first electrode 355 contacts the fuse element 375). By reducing the effective phase region of the phase change material in the fuse element 375, the fuse device of FIG. 4B can have a lower blow-out current compared to a conventional fuse device in the prior art.

The thickness of the phase change material layer 360 may be modified to further reduce the blow-out current of the fuse device of FIG. 4B. In some embodiments, the phase change material layer 360 may have a thickness less than or equal to about 30 nm.

In some embodiments, a fuse device manufactured using methods of the inventive concept may include a fuse element and a first electrode. The fuse element may include a phase change material having a layer thickness less than or equal to about 30 nm, and the first electrode may be formed having a sublithographic dimension. In the above embodiments, when a pulse current (e.g., less than or equal to about 3 mA) is applied to the fuse element via the first electrode, the fuse element may undergo a phase change, which can result in the fuse element shrinking and peeling off from the electrode, thereby converting the fuse device into a blow-out state. The time required for the blow-out may be on the order of nanoseconds (ns) (e.g., from about several ns to about several hundreds of ns). In contrast, the blow-out time for a conventional fuse device in the prior art may be on the order of milliseconds (ms). Thus, by adjusting (e.g., reducing) the dimension of the first electrode at the portion in contact with the fuse element and/or the layer thickness of the phase change material, the current required to blow the fuse device can be minimized (e.g., to less than or equal to about 3 mA).

As a result, a fuse device according to an embodiment of the inventive concept can have a lower blow-out current compared with a conventional fuse device in the prior art. The lower blow-out current reduces power consumption of the fuse device, and allows the fuse device to occupy less area on the semiconductor chip compared to a conventional fuse device.

In some embodiments, after forming the fuse element 375 shown in FIG. 4B, a second electrode (e.g., second electrode 390) may be formed, wherein the first electrode (e.g., first electrode 355) and the second electrode (e.g., second electrode 390) are located on opposite sides of the fuse element 375. A method for manufacturing the second electrode according to an embodiment of the inventive concept is next described in detail below with reference to FIGS. 5A to 5C.

Figure 5A:
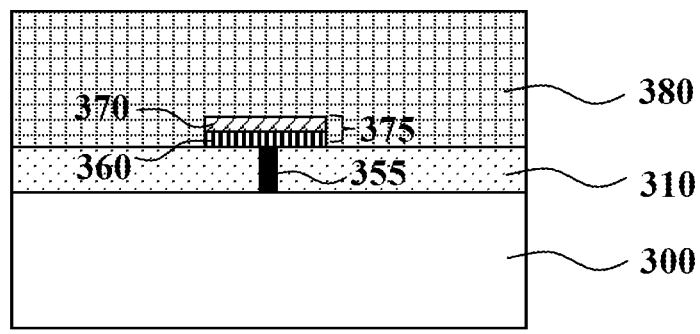
FIGS. 5A to 5C are cross-sectional views of a fuse device at different stages of fabrication according to another embodiment of the inventive concept.

First, as shown in FIG. 5A, a dielectric layer 380 is formed over the structure of FIG. 4B. The dielectric layer 380 may be formed using appropriate deposition methods. In some embodiments, the dielectric layer 380 may be formed of silicon oxide.

Figure 5B:
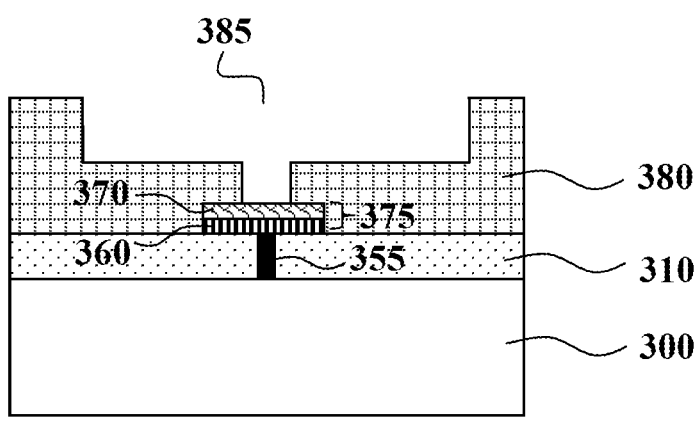

Next, as shown in FIG. 5B, a via hole 385 is formed in the dielectric layer 380, with the via hole 385 exposing a portion of the fuse element 375. The via hole 385 may be formed using appropriate processes in the art. In some embodiments, the via hole 385 may be formed using a dual damascene process.

Figure 5C:
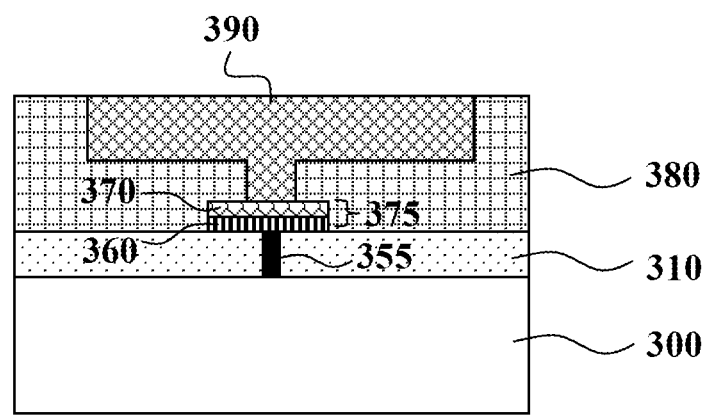

Finally, as shown in FIG. 5C, a second electrode 390 is formed in the via hole 385, with a bottom surface of the second electrode 390 in contact with a top surface of the fuse element 375.

In some embodiments, the second electrode 390 may include a metal wire (not shown) connected to the second electrode 390. The metal wire may include a seed layer. In some embodiments, a seed layer can be formed over the structure of FIG. 5B, followed by electrochemical plating of a copper (ECP Cu) layer on the seed layer, and planarization of the ECP Cu layer using a polishing process (e.g., a CMP process) to form the second electrode 390. The material of the second electrode 390 is not limited to copper and may include, for example, aluminum (Al) or any other conductive material.

Although FIG. 5C shows the fuse element 375 formed to be embedded in the intermetallic dielectric 380, the inventive concept is not limited thereto. For example, in some embodiments, the fuse element 375 may be formed to be embedded in an interlayer dielectric.

Also, although FIG. 5C shows the thermal insulating layer 370 formed between the second electrode 390 and the phase change material layer 360, the inventive concept is not limited thereto. For example, in some embodiments, the thermal insulating layer 370 can be formed between the first electrode 355 and the phase change material layer 360. In some other embodiments, the thermal insulating layer 370 can be formed between the second electrode 390 and the phase change material layer 360, and between the phase change material layer 360 and the first electrode 355. As previously described, in some embodiments, the thermal insulating layer is optional and need not be included in the fuse device.

In some embodiments, the technical advantages of the inventive concept as previously described (e.g., low blowout current, low power consumption, reduction in area occupied by fuse device on semiconductor device, etc.) can be achieved if either one or more of the first electrode 355 and the second electrode 390 have a sublithographic dimension at a portion where the (first and/or second) electrode contacts the fuse element 375.

Those skilled in the art will readily appreciate from the above teachings that an electrode having a sublithographic dimension can be manufactured using the electrode manufacturing method in the present disclosure. Some details that are well known in the art have not been described in the present disclosure to avoid obscuring the inventive concept. However, those skilled in the art will be able to implement the technical solutions disclosed herein based on the above description.

While the inventive concept has been described with reference to different embodiments, it is noted that the present disclosure is not limited to the above embodiments, and the embodiments may be modified without departing from the scope and spirit of the present disclosure. The scope of the following claims is to be accorded the broadest interpretation, which encompasses all modifications and equivalent structures and functions.

What is claimed is:

1. A method for manufacturing a fuse device, comprising:
    forming a first dielectric layer on a substrate, forming a second dielectric layer on the first dielectric layer, and forming a third dielectric layer on the second dielectric layer;
    forming, by a first etching process, a first via hole in the second dielectric layer and the third dielectric layer;
    forming a fourth dielectric layer on the third dielectric layer, wherein a first portion of the fourth dielectric layer is formed on sidewalls of the first via hole, a second portion of the fourth dielectric layer is formed on a bottom surface of the first via hole, and third portions of the fourth dielectric layer are formed on top surfaces of the third dielectric layer external to the first via hole, and wherein the fourth dielectric layer is completely filled and formed conformally on the third dielectric layer;
    removing, by a second etching process, the second and third portions of the fourth dielectric layer;
    forming, by a third etching process, a second via hole in the first dielectric layer using the first portion of the fourth dielectric layer as an etching barrier layer, wherein the second via hole extends through the first dielectric layer to a surface of the substrate;
    filling the second via hole with an electrode material; and
    forming, by a polishing process, a first electrode, wherein the first electrode is embedded in the first dielectric layer.

2. The method according to claim 1, wherein a width of the first electrode, at a portion where the first electrode contacts a fuse element, includes a sublithographic dimension.

3. The method according to claim 2, wherein the sublithographic dimension is less than or equal to about 100 nm.

4. The method according to claim 3, wherein the sublithographic dimension is less than or equal to about 75 nm.

5. The method according to claim 1, further comprising:
    forming a fuse element in contact with the first electrode, wherein the fuse element includes a phase change material.

6. The method according to claim 5, wherein the phase change material includes doped or undoped chalcogenide.

7. The method according to claim 6, wherein the phase change material includes doped or undoped Ge—Sb—Te, or doped or undoped Sb—Te.

8. The method according to claim 5, wherein the phase change material has a layer thickness less than or equal to about 30 nm.

9. The method according to claim 8, wherein, when a pulse current less than or equal to about 3 mA is applied to the fuse element via the first electrode, the fuse element undergoes a phase change, so as to convert the fuse device into a blow-out state.

10. The method according to claim 5, wherein the fuse element and the first electrode are embedded in one or more interlayer dielectrics or intermetallic dielectrics.

11. The method according to claim 5, further comprising:
forming a second electrode, wherein the first electrode and the second electrode are located on opposite sides of the fuse element.

* * * * *